(12) United States Patent
Jo et al.

(10) Patent No.: US 11,135,624 B2
(45) Date of Patent: Oct. 5, 2021

(54) METHOD AND APPARATUS FOR SUBSTRATE CLEANING

(71) Applicant: SEMES CO., LTD., Cheonan-si (KR)

(72) Inventors: Mi Young Jo, Hwaseong-si (KR); Da Jeong Kim, Seoul (KR); Ye Rim Yeon, Hwaseong-si (KR); Jun Taek Koo, Incheon (KR)

(73) Assignee: SEMES CO., LTD., Cheonan-si (KR)

( * ) Notice: Subject to any disclaimer, the term of this patent is extended or adjusted under 35 U.S.C. 154(b) by 0 days.

(21) Appl. No.: 16/379,294

(22) Filed: Apr. 9, 2019

(65) Prior Publication Data
US 2019/0308227 A1 Oct. 10, 2019

(30) Foreign Application Priority Data
Apr. 10, 2018 (KR) .................. 10-2018-0041471

(51) Int. Cl.
| | | |
|---|---|---|
| *B08B 7/00* | (2006.01) | |
| *H01L 21/02* | (2006.01) | |
| *H01L 21/67* | (2006.01) | |
| *B08B 3/10* | (2006.01) | |
| *H01L 21/324* | (2006.01) | |

(52) U.S. Cl.
CPC .............. *B08B 7/0014* (2013.01); *B08B 3/10* (2013.01); *H01L 21/02041* (2013.01); *H01L 21/324* (2013.01); *H01L 21/67051* (2013.01); *H01L 21/67109* (2013.01)

(58) Field of Classification Search
CPC ............. H01L 21/02041; H01L 21/324; H01L 21/67051; H01L 21/67109
See application file for complete search history.

(56) References Cited

U.S. PATENT DOCUMENTS

| | | | | |
|---|---|---|---|---|
| 5,421,897 A | * | 6/1995 | Grawe ................. | B08B 7/0014 134/6 |
| 5,505,787 A | * | 4/1996 | Yamaguchi ............... | A47L 1/08 134/26 |
| 6,165,282 A | * | 12/2000 | Marshall ............... | B08B 7/0021 134/10 |
| 2003/0000547 A1 | * | 1/2003 | Carpenter ............ | B08B 7/0014 134/1.3 |
| 2007/0215177 A1 | * | 9/2007 | Uchino .................... | B08B 3/12 134/10 |
| 2009/0151752 A1 | * | 6/2009 | Mui .................. | H01L 21/67051 134/21 |

(Continued)

FOREIGN PATENT DOCUMENTS

| | | |
|---|---|---|
| KR | 10-2009-0108857 A | 10/2009 |
| KR | 10-2012-0048562 A | 5/2012 |

(Continued)

*Primary Examiner* — Sharidan Carrillo (57) ABSTRACT

An embodiment of the present invention provides a substrate cleaning method including: supplying of a liquid cleaning solution containing a thermoreactive polymer resin in a solvent to a substrate; trapping of particles by gelling the liquid cleaning solution by phase transition through first heat treatment; liquefying of the gel-state cleaning solution with the particle trapped therein by phase transition through second heat treatment; and removing of the liquefied cleaning solution by supplying a rinse solution.

12 Claims, 5 Drawing Sheets

(56) References Cited

U.S. PATENT DOCUMENTS

| | | | | |
|---|---|---|---|---|
| 2010/0258142 A1* | 10/2010 | Kawaguchi | ....... | H01L 21/02057 |
| | | | | 134/1.3 |
| 2012/0055865 A1* | 3/2012 | Mohseni | ................... | C11D 7/50 |
| | | | | 210/348 |
| 2012/0132229 A1* | 5/2012 | Zhu | ...................... | C11D 3/3773 |
| | | | | 134/7 |
| 2014/0338698 A1* | 11/2014 | Humphrey | .............. | B08B 1/007 |
| | | | | 134/6 |
| 2016/0035564 A1* | 2/2016 | Aibara | .............. | H01L 21/02057 |
| | | | | 134/4 |
| 2016/0163534 A1 | 6/2016 | Kaneko et al. | | |
| 2019/0308227 A1* | 10/2019 | Jo | ..................... | H01L 21/02057 |

FOREIGN PATENT DOCUMENTS

| | | |
|---|---|---|
| KR | 10-2014-0019741 A | 2/2014 |
| WO | 2011008658 A1 | 1/2011 |

\* cited by examiner

METHOD AND APPARATUS FOR SUBSTRATE CLEANING

CROSS REFERENCE TO RELATED APPLICATION

The present application claims priority under 35 U.S.C. 119 to Korean Patent Application No. 10-2018-0041471, filed Apr. 10, 2018 in the Korean Intellectual Property Office, the entire contents of which is incorporated by reference herein in its entirety.

BACKGROUND OF THE INVENTION

Field of the Invention

The present invention relates generally to a method and an apparatus for substrate cleaning. More particularly, the present invention relates to a method and an apparatus for removing particles attached on a substrate by using a thermoreactive polymer.

Description of the Related Art

Generally, electronic devices such as semiconductors and displays are manufactured by performing unit processes such as thin film formation, photoresist pattern formation, etching and cleaning. When unit processes for fabricating semiconductor devices are performed, particles may be attached to a substrate surface or patterns of a wafer or the like.

Accordingly, various cleaning methods have been proposed for removing particles attached to a substrate.

Figure 1:
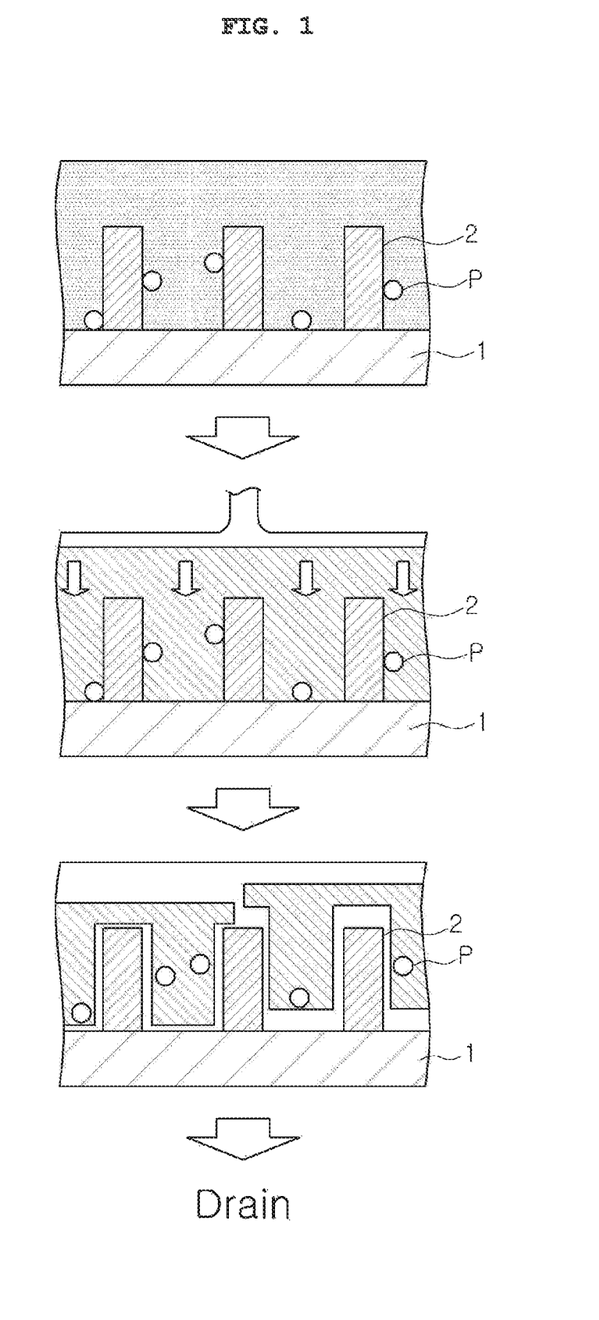
FIG. 1 is a schematic view showing a substrate cleaning method according to a conventional art.
Figure 2:
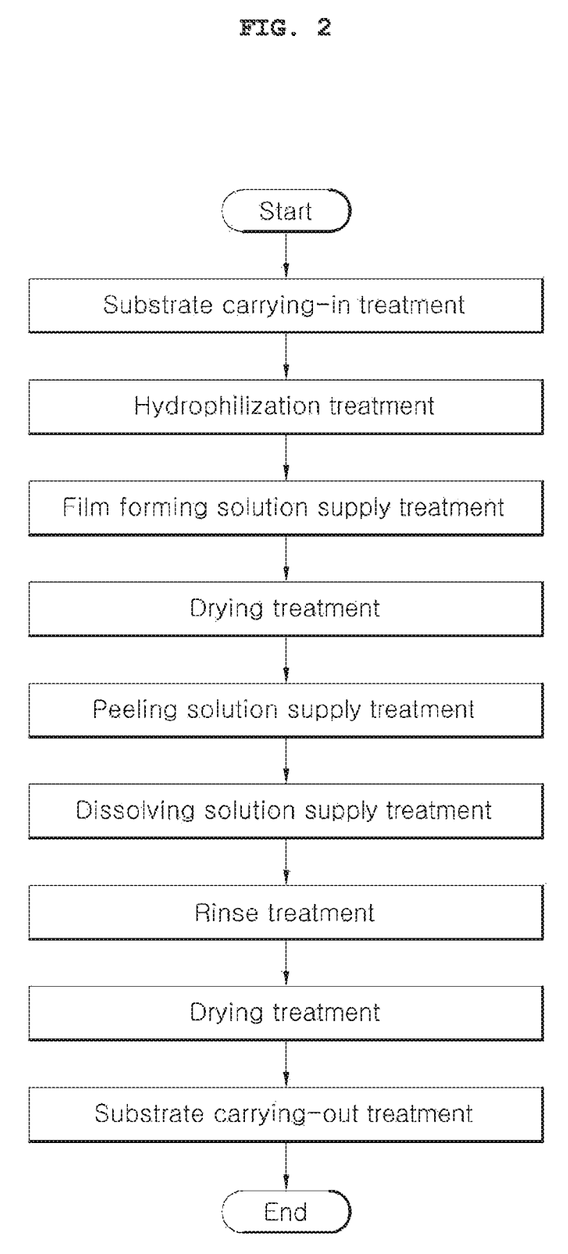
FIG. 2 is a flowchart showing the substrate cleaning method according to the conventional art.

For example, FIGS. 1 and 2 show a substrate cleaning method disclosed in Korean Patent Application Publication No. 10-2015-0055591.

In the conventional art, a film forming solution containing a volatile component is supplied to a substrate 10 and heated at a high temperature to volatilize the volatile component contained in the film forming solution. In this process, as the film forming solution is solidified or cured, the particles attached to the substrate surface are trapped.

Next, a peeling solution is supplied to peel the solidified or cured film forming solution from the substrate surface, then a dissolving solution is supplied to dissolve the film forming solution and then is removed by rinse treatment. In this process, the particles trapped in the film forming solution are also removed.

However, the conventional art is problematic in that a high temperature of 100° C. or more is required for volatilization for solidifying or curing the film forming solution.

The conventional art is further problematic in that in order to remove a film forming layer, a process of supplying the peeling solution and the dissolving solution is required, so the process is complicated and expensive materials are used. In addition, since the effluent discharged from the cleaning chamber after the cleaning process is mixed with the film forming solution, the peeling solution, and the dissolving solution, and the dissolving solution usually breaks the polymer network in the film forming solution, it is difficult to reuse the film forming solution.

Further, when an alkaline solution is used as the dissolving solution, an underlying film such as metal patterns 2 formed on the substrate 10 may be damaged.

In addition, in Korean Patent No. 1376911, there has been disclosed a technique in which a viscous liquid in which solid components are dispersed is applied as a cleaning solution, and contaminants are removed by interaction between the solid components and the substrate contaminants. However, since the solid components contained in the cleaning solution physically interact with the contaminants on the substrate to remove contaminants, it is difficult to apply the technique to a wafer having patterns. Not only is it difficult to supply the viscous liquid to the substrate, but it is difficult to completely remove the viscous liquid from the substrate after the cleaning is completed, so residue may remain.

The foregoing is intended merely to aid in the understanding of the background of the present invention, and is not intended to mean that the present invention falls within the purview of the related art that is already known to those skilled in the art.

DOCUMENTS OF RELATED ART (Patent Document 1) Korean Patent Application Publication No. 10-2015-0055591

(Patent Document 2) Korean Patent No. 1376911

SUMMARY OF THE INVENTION

Accordingly, the present invention has been made keeping in mind the above problems occurring in the related art, and the present invention is intended to propose a method and an apparatus for substrate cleaning, which can simplify the cleaning process for a substrate.

The present invention is further intended to propose a method and an apparatus for substrate cleaning, which can be applied to the substrate with patterns while minimizing damage to the patterns.

The objects of the present invention are not limited to those described above, and other objects and advantages of the present invention which are not mentioned can be understood by the following description.

In order to achieve the above object, according to some aspect of the present invention, there is provided a substrate cleaning method including: supplying of a liquid cleaning solution containing a thermoreactive polymer resin in a solvent to a substrate; trapping of particles by gelling the liquid cleaning solution by phase transition through first heat treatment; liquefying of the gel-state cleaning solution with the particle trapped therein by phase transition through second heat treatment; and removing of the liquefied cleaning solution by supplying a rinse solution.

The thermoreactive polymer resin may be gelled when heated at a temperature equal to higher than a phase transition temperature and may be liquefied when cooled at a temperature below the phase transition temperature.

For example, the thermoreactive polymer resin may include at least one of poly(N-isopropylacrylamide), poly(N,N-diethylacrylamide), poly(N-ethylmethacylamide), poly(methyl vinyl ether), poly(2-ethoxyethyl vinyl ether), poly(N-vinylcaprolactam), poly(N-vinylisobutyramide), poly(N-N-vinyl-n-butyramide), poly(dimethylaminoethyl methacrylate), poly(N-(L)-(1-hydroxymethyl) propyl methacrylamide, poly(ethylene glycol)/(poly(lactide-co-glicolide), polyoxyethylene-polyoxypropylene, polyoxyethylene-polyoxypropylene-polyoxyethylene, and poly(ethylene glycol) poly(lactic acid)-poly(ethylene glycol).

The thermoreactive polymer resin may be liquefied when heated at a temperature equal to or higher than a phase transition temperature and may be gelled when cooled at a temperature below the phase transition temperature.

For example, the thermoreactive polymer resin may include at least one of gelatin, poly(N-acryloylglycinamide), poly(acrylamide-co-acrylonitrile), Poly(methacrylamide), poly(acrylic acid), poly(allylamine-co-allylurea), poly(ethylene oxide), poly(vinylmethylether), Poly(hydroxyethyl methacrylate), N-vinylimidazole, and 1-vinyl-2-(hydroxylmethyl)imidazole.

The phase transition temperature of the thermoreactive polymer resin may range from 20° C. to 60° C.

The solvent of the cleaning solution may be a polar erotic solvent.

For example, the solvent of the cleaning solution may include at least one of water, methanol, ethanol, IPA, and acetic acid.

The rinse solution may be applied with a same component as the solvent of the cleaning solution.

The substrate cleaning method may further include recycling of an effluent with a mixture of the cleaning solution and the rinse solution as the cleaning solution after filtering.

The substrate cleaning method may further include adjusting of a concentration of the filtered solution by evaporating the solvent from the filtered solution or by adding a thermoreactive polymer resin to the filtered solution.

In order to achieve the above object, according to some aspect of the present invention, there is further provided a substrate processing apparatus, which is used to remove particles attached to a substrate, the apparatus including: a cleaning solution supply means for supplying a liquid cleaning solution containing a thermoreactive polymer resin in a solvent to the substrate; a first heat treatment means for gelling the cleaning solution supplied to the substrate by phase transition through first heat treatment; a second heat treatment means for liquefying the gel-state cleaning solution by phase transition through second heat treatment; and a rinse solution supply means for removing the liquefied cleaning solution by supplying a rinse solution to the substrate.

Here, when the thermoreactive polymer resin is a material that is gelled when heated at a temperature equal to or higher than a phase transition temperature and is liquefied when cooled at a temperature below the phase transition temperature, the first heat treatment means may be a heating means, and the second heat treatment means may be a cooling means.

Alternatively, when the thermoreactive polymer resin is a material that is liquefied when heated at a temperature equal to or higher than a phase transition temperature and is gelled when cooled at a temperature below the phase transition temperature, the first heat treatment means may be a cooling means, and the second heat treatment means may be a heating means.

The substrate processing apparatus may further include: a filtering means for filtering an effluent discharged after cleaning to remove the particles; and a concentration adjusting means for adjusting a concentration to reuse the filtered solution as the cleaning solution.

According to the embodiment of the present invention, it is advantageous in that since the liquid cleaning solution is supplied to the substrate, and particles attached to the substrate are trapped by gelling the liquid cleaning solution by phase transition through heat treatment and removed using the rinse solution, it is possible to improve cleaning efficiency. In addition, the cleaning process is simplified and the supply of the cleaning solution is easy because the cleaning solution is supplied in the liquid state.

Further, since the embodiment of the present invention is not a physical cleaning, it can be applied to the substrate with patterns and it can prevent damage to the pattern.

According to the embodiment of the present invention, it is further advantageous in that since the gelled cleaning solution for trapping particles is liquefied and rinsed, it is possible to minimize the residue of particles on the substrate after cleaning.

Further, according to the embodiment of the present invention, when the solvent used in the cleaning solution is used as the rinse solution, the solution discharged after cleaning becomes a cleaning solution with a low concentration, so it is possible to reduce the process cost by removing only the particles from the discharged solution through filtering and reusing the solution as the cleaning solution through the concentration adjusting process (polymer addition, solution evaporation, etc.).

It should be understood that the effects of the present invention are not limited to the effects described above and include all effects that can be deduced from the details of the present invention or the composition of the invention described in the claims.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Hereinbelow, exemplary embodiments of the present invention will be described in detail with reference to the accompanying drawings. It should be understood that the present invention may be variously embodied, without being limited to the exemplary embodiments.

It will be further understood that the terms "comprise", "include", "have", etc. when used in this specification, specify the presence of stated features, integers, steps, operations, elements, components, and/or combinations thereof but do not preclude the presence or addition of one or more other features, integers, steps, operations, elements, components, and/or combinations thereof. The terminology used herein is for the purpose of describing particular embodiments only and is not intended to be limiting. Unless otherwise defined, all terms including technical and scientific terms used herein have the same meaning as commonly understood by one of ordinary skill in the art to which this invention belongs.

Figure 3:
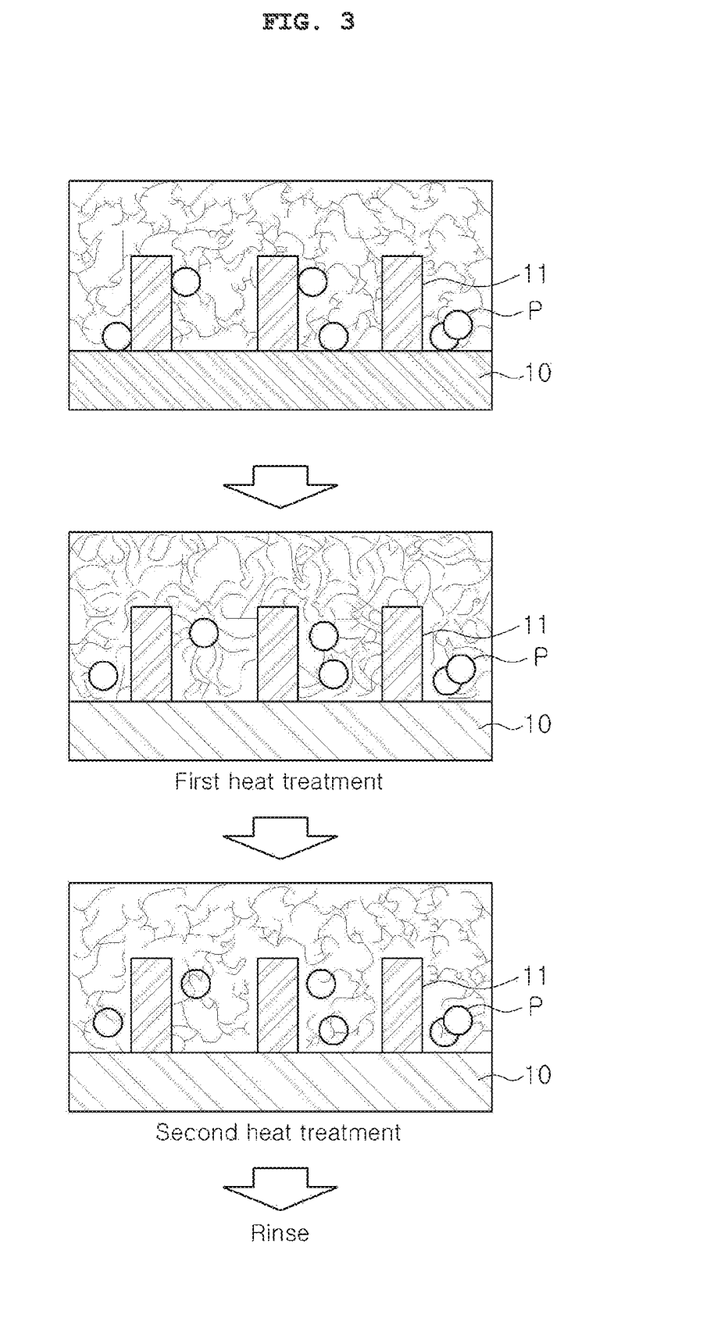
FIG. 3 is a schematic view showing a substrate cleaning method according to a first embodiment of the present invention.
Figure 4:
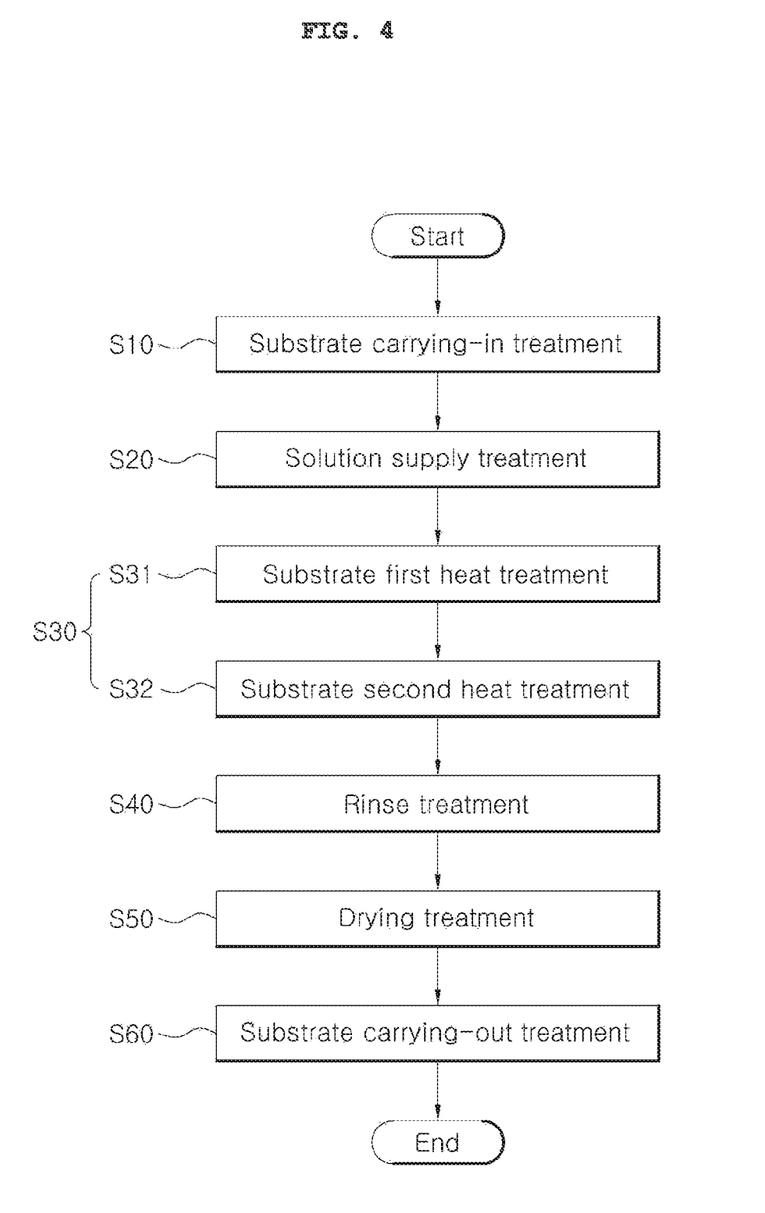
FIG. 4 is a flowchart showing the substrate cleaning method according to the first embodiment of the present invention.

FIGS. 3 and 4 show a substrate cleaning method according to a first embodiment of the present invention.

With reference to FIGS. 3 and 4, the substrate cleaning method according to the first embodiment includes: a substrate carrying-in step (S10); a cleaning solution supply step (S20); a cleaning solution heat treatment step (S30); a rinse step (S40); a drying step (S50); and a substrate carrying-out step (S60).

In the substrate carrying-in step (S10), a substrate 10 is transported into a process chamber. For example, the substrate 10 may be transferred by a substrate transfer device to a cleaning chamber where the cleaning process proceeds.

The cleaning chamber may be provided therein with a spin chuck to which the substrate 10 is seated and rotated at a predetermined speed, and the substrate 10 may be disposed on the spin chuck such that the surface on which patterns 11 are formed faces upward In the cleaning solution supply step (S20), the cleaning solution is supplied to the substrate transferred to the cleaning chamber. The cleaning solution may be supplied from a nozzle placed at the upper portion of the cleaning chamber to one surface of the substrate where the patterns are formed. Here, the substrate may be rotated at a predetermined speed by rotation of the spin chuck or the like, and the cleaning solution supplied to the substrate diffuses to the upper surface of the substrate by the centrifugal force that accompanies the rotation of the substrate so that it can be evenly applied to the gap between the patterns.

In the first embodiment, the cleaning solution is a solution containing a thermoreactive polymer resin in a solvent. Here, the solvent of the cleaning solution may be a polar protic solvent with high dielectric constant and high polarity. For example, the solvent may include at least one of water, methanol, ethanol, IPA, and acetic acid.

Meanwhile, the thermoreactive polymer resin applied to the first embodiment may be a polymer resin with a lower phase transition temperature (LCST; lower critical solution temperature) ranging from 20° C. to 60° C. Accordingly, the cleaning solution supplied to the substrate can be phase-transformed into a gel state through heat treatment such as heating or cooling at a relatively low temperature.

Here, the thermoreactive polymer resin may be a polymer resin that is gelled when heated at a temperature equal to or higher than a phase transition temperature and is liquefied when cooled at a temperature below the phase transition temperature.

For example, the thermoreactive polymer resin may include at least one of poly(N-isopropylacrylamide), poly (N,N-diethylacrylamide), poly(N-ethylmethacylamide), poly(methyl vinyl ether), poly(2-ethoxyethyl vinyl ether), poly(N-vinylcaprolactam), poly(N-vinylisobutyramide), poly(N-N-vinyl-n-butyramide), poly(dimethylaminoethyl methacrylate), poly(N-(L)-(1-hydroxymethyl) propyl methacrylamide, poly(ethylene glycol)/(poly(lactide-co-glicolide), polyoxyethylene-polyoxypropylene, polyoxyethylene-polyoxypropylene-polyoxyethylene, and poly(ethylene glycol)-poly(lactic acid)-poly(ethylene glycol).

Further, the thermoreactive polymer resin may be a polymer resin that is liquefied when heated at a temperature equal to or higher than a phase transition temperature and is gelled when cooled at a temperature below the phase transition temperature.

For example, the thermoreactive polymer resin may include at least one of gelatin, poly(N-acryloylglycinamide), poly(acrylamide-co-acrylonitrile), Poly(methacrylamide), poly(acrylic acid), poly(allylamine-co-allylurea), poly(ethylene oxide), poly(vinylmethylether), Poly(hydroxyethyl methacrylate), N-vinylimidazole, and 1-vinyl-2-(hydroxylmethyl)imidazole.

The cleaning solution heat treatment step (S30) may be divided into a first heat treatment step (S31) of gelling the cleaning solution, and a second heat treatment step (S32) of liquefying the gel-state cleaning solution.

In the first heat treatment step (S31) of the cleaning solution heat treatment step (S30), the cleaning solution supplied to the substrate is phase-transformed into a gel state through heat treatment.

When the cleaning solution is phase-transformed into a gel state, the volume thereof is changed, and thus the phase-transformed cleaning material traps the particles P attached to the substrate surface.

For example, when the cleaning solution of the first embodiment is applied with a thermoreactive polymer that is phase-transformed from a liquid state into a gel state when heated at a temperature equal to or higher than a phase transition temperature, the liquid cleaning solution containing the thermoreactive polymer is applied to the substrate, and the thermoreactive polymer solution is heated at a temperature equal to or higher than the phase transition temperature, and thereby, the thermoreactive polymer solution is phase-transformed from a liquid state into a gel state.

When the thermoreactive polymer solution is gelled, the gel-state cleaning solution traps particles attached on the substrate. Accordingly, the particles can be removed from the substrate surface or the pattern.

In the second heat treatment step (S32) of the cleaning solution heat treatment step (330), the cleaning solution phase-transformed into a gel state is phase-transformed again into a liquid state through heat treatment.

When the gel-state cleaning solution is phase-transformed into a liquid state through the second heat treatment step (332), in the subsequent step, the rinse step, it is easier to remove the cleaning solution from the substrate surface.

The rinse step (S40) is a step of removing the cleaning solution and the particles from the substrate surface by supplying the rinse solution to the substrate, wherein the effluent mixed with the cleaning solution and the rinse solution is discharged outside the cleaning chamber through a drainage line.

After the rinse step (S40), the drying step (S50) may be followed to dry the substrate and take the substrate outside the cleaning chamber. In the drying step (S50), the rinse solution remaining on the substrate can be dried by increasing the rotation speed of the substrate.

As described above, since the present invention uses a solution that is phase-transformed from a liquid state to a gel state at a relatively low temperature as a cleaning solution, particles can be effectively removed without a high temperature heating process for solidification or curing.

Further, since the cleaning solution is supplied to the substrate in the liquid state, it is easy to supply the cleaning solution; and the gelled cleaning solution is phase-transformed again into the liquid state and then is removed by using the rinse solution, an expensive peeling treatment solution or dissolution treatment solution is unnecessary, and there is no problem that the polymer remains on the substrate surface.

Further, since the particles are trapped during the gelation of the cleaning solution, the problem of damaging the patterns formed on the substrate during cleaning is minimized.

Figure 5:
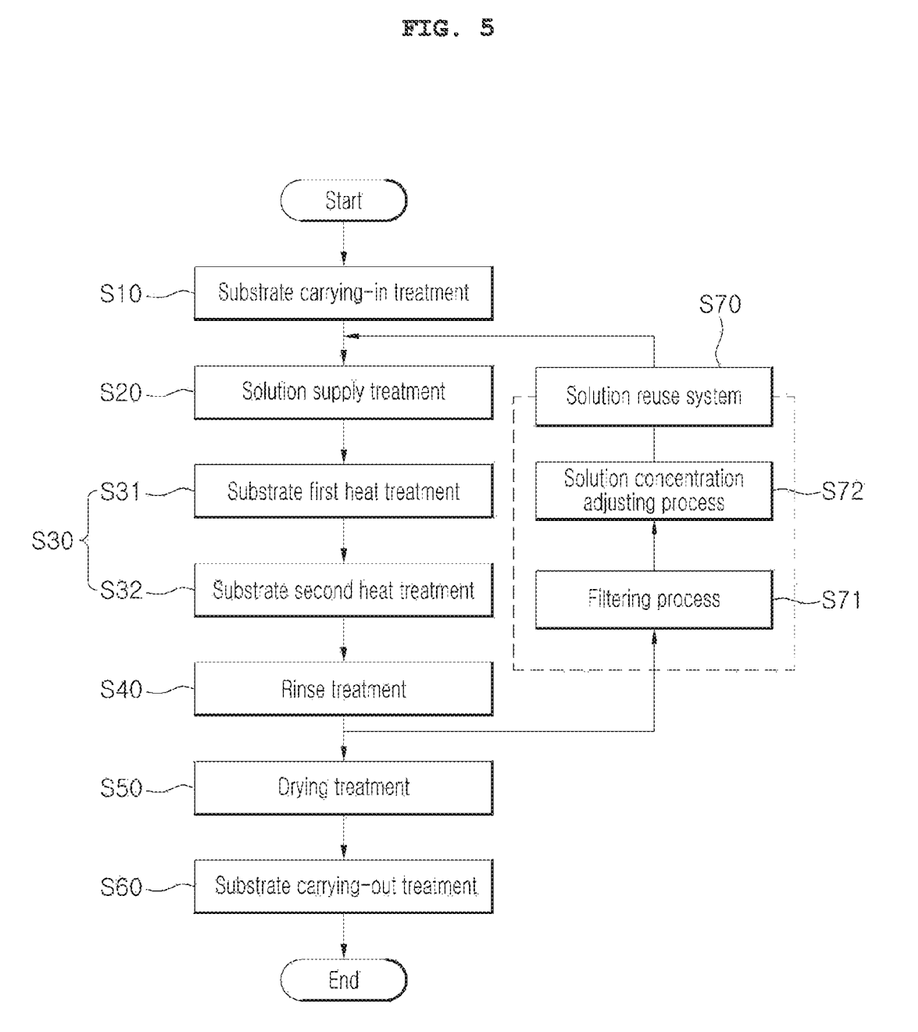
FIG. 5 is a flowchart showing a substrate cleaning method according to a second embodiment of the present invention.

FIG. 5 is a flowchart showing a substrate cleaning method according to a second embodiment of the present invention.

With reference to FIG. 5, the substrate cleaning method according to the second embodiment includes: the substrate carrying-in step (S10); the cleaning solution supply step (S20); the cleaning solution heat treatment step (S30); the rinse step (S40); the drying step (S50); the substrate carrying-out step (S60); and a solution reuse step (S70).

In other words, although the substrate cleaning method according to the second embodiment is similar to the substrate cleaning method of the first embodiment, the substrate cleaning method according to the second embodiment further includes the solution reuse step. Accordingly, hereinafter, a detailed description of a configuration similar to the substrate cleaning method of the first embodiment is omitted.

The solution reuse step (S70) is a step for reusing the cleaning solution after filtering the foreign substances (S71).

In other words, the gel-state cleaning solution trapping the particles attached on the substrate is phase-transformed again into a liquid state, and is discharged as the effluent along with the rinse solution through the drainage line. Here, when the same solution as the solvent of the cleaning solution is used as the rinse solution, the rinse solution can have the same composition as the cleaning solution except for the thermoreactive polymer resin. In other words, when the particles are removed by filtering the effluent discharged through the drainage line, the filtered solution is the same as the diluted ingredients of the cleaning solution initially supplied. Therefore, the solution passing through the drainage line and the filter can be reused as the cleaning solution through the cleaning solution concentration adjusting step (S72) required for the cleaning process.

Here, as the method of adjusting the concentration of the cleaning solution concentration, the solvent may be evaporated from the filtered solution or a thermoreactive polymer resin may be added to the filtered solution.

As described above, according to the embodiment of the present invention, when using rinse solution with the same composition as the solvent used in the cleaning solution, the solution discharged to the drainage line after cleaning the substrate becomes a cleaning solution with low concentration, so it is possible to reduce the process cost by removing only the particles from the discharged solution through filtering and reusing the solution as a cleaning solution through the concentration adjusting process (polymer addition, solution evaporation, etc.).

A substrate processing apparatus for performing the substrate cleaning method according to the embodiments of the present invention includes: a cleaning solution supply means for supplying a liquid cleaning solution containing a thermoreactive polymer resin in a solvent to the substrate; a first heat treatment means for gelling the cleaning solution supplied to the substrate by phase transition through first heat treatment; a second heat treatment means for liquefying the gel-state cleaning solution by phase transition through second heat treatment; and a rinse solution supply means for removing the liquefied cleaning solution by supplying a rinse solution to the substrate.

Here, when the thermoreactive polymer resin is a material that is gelled when heated at a temperature equal to or higher than a phase transition temperature and is liquefied when cooled at a temperature below the phase transition temperature, the first heat treatment means may be a heating means, and the second heat treatment means may be a cooling means. On the contrary, when the thermoreactive polymer resin is a material that is liquefied when heated at a temperature equal to or higher than a phase transition temperature and is gelled when cooled at a temperature below the phase transition temperature, the first heat treatment means may be a cooling means, and the second heat treatment means may be a heating means.

The heating means and the cooling means may be a heater, a coolant flow passage, or the like provided in a mounting table on which the substrate is placed, or may be means for supplying a temperature-controlled gas to the upper surface of the substrate, but may be various means not being limited thereto. In some cases, the heating means and the cooling means may be configured as one means of performing both heating and cooling functions.

Further, the substrate processing apparatus according to the present invention may further include: a filtering means for filtering the effluent discharged after cleaning to remove the particles; and a concentration adjusting means for adjusting a concentration to reuse the filtered solution as the cleaning solution.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. It is thus well known to those skilled in that art that the present invention is not limited to the embodiment disclosed in the detailed description, and the patent right of the present invention should be defined by the scope and spirit of the invention as disclosed in the accompanying claims.

Accordingly, it should be understood that the present invention includes various modifications, additions and substitutions without departing from the scope and spirit of the invention as disclosed in the accompanying claims.

What is claimed is:

1. A substrate cleaning method comprising:
    supplying a liquid cleaning solution containing a thermoreactive polymer resin in a solvent to a substrate, wherein the thermoreactive polymer resin has a phase transition temperature,
    wherein the phase transition temperature of the thermoreactive polymer resin has a value from 20° C. to 60° C.;
    trapping particles by changing the liquid cleaning solution into a gel-state cleaning solution by phase transition of the thermoreactive polymer resin by heating the liquid cleaning solution through a first heat treatment;
    liquefying the gel-state cleaning solution with the particle trapped therein by phase transition of the thermoreactive polymer resin by cooling the gel-state cleaning solution through a second heat treatment; and
    removing the liquefied cleaning solution by supplying a rinse solution thereto,
    wherein the thermoreactive polymer resin is gelled when the first heat treatment is performed at a temperature equal to or higher than the phase transition temperature of the thermoreactive polymer resin and is liquefied when the second heat treatment is performed at a temperature below the phase transition temperature.

2. The method of claim 1,
    wherein the thermoreactive polymer resin includes at least one of poly(N-isopropylacrylamide), poly(N, N-diethylacrylamide), poly(N-ethylmethacylamide), poly(methyl vinyl ether), poly(2-ethoxyethyl vinyl ether), poly(N-vinylcaprolactam), poly(N-vinylisobutyramide), poly(N-N-vinyl-n-butyramide), poly(dimethylaminoethyl methacrylate), poly(N-(L)-(1-hydroxymethyl) propyl methacrylamide, poly(ethylene glycol)/(poly(lactide-co-glicolide), polyoxyethylene-polyoxypropylene, polyoxyethylene-polyoxypropylene-polyoxyethylene, and poly(ethylene glycol)-poly(lactic acid)-poly(ethylene glycol).

3. The method of claim 1,
wherein the solvent of the liquid cleaning solution is a polar protic solvent.

4. The method of claim 1,
wherein the rinse solution is a solvent which is the same as the solvent of the liquid cleaning solution.

5. The method of claim 3,
wherein the solvent of the liquid cleaning solution includes at least one of water, methanol, ethanol, IPA, and acetic acid.

6. The method of claim 4, further comprising:
discharging, as an effluent, a mixture of the liquid cleaning solution and the rinse solution; and
filtering and recycling the effluent as a new cleaning solution.

7. The method of claim 6, further comprising:
adjusting a concentration of the new cleaning solution.

8. The method of claim 7,
wherein the adjusting of the concentration of the new cleaning solution comprises:
evaporating a part of the solvent from the new cleaning solution or adding thermoactive polymer resin to the new cleaning solution.

9. A substrate cleaning method comprising:
supplying a liquid cleaning solution containing a thermoreactive polymer resin in a solvent to a substrate, wherein the thermoreactive polymer resin has a phase transition temperature,
wherein the phase transition temperature of the thermoreactive polymer resin ranges from 20° C. to 60° C.;
trapping particles by changing the liquid cleaning solution into a gel-state cleaning solution by phase transition of the thermoreactive polymer resin by cooling the liquid cleaning solution through a first heat treatment;
liquefying the gel-state cleaning solution with the particle trapped therein by phase transition of the thermoreactive polymer resin by heating the gel-state cleaning solution through a second heat treatment; and
removing the liquefied cleaning solution by supplying a rinse solution thereto,
wherein the thermoreactive polymer resin is liquefied when the second heat treatment is performed at a temperature equal to or higher than the phase transition temperature of the thermoreactive polymer resin and is gelled when the first heat treatment is performed at a temperature below the phase transition temperature.

10. The method of claim 9,
wherein the thermoreactive polymer resin includes at least one of gelatin, poly(N-acryloylglycinamide), poly(acrylamide-co-acrylonitrile), Poly(methacrylamide), poly(acrylic acid), poly(allylamine-co-allylurea), poly(ethylene oxide), poly(vinylmethylether), Poly(hydroxyethyl methacrylate), N-vinylimidazole, and 1-vinyl-2-(hydroxylmethyl)imidazole.

11. The method of claim 9,
wherein the rinse solution is a solvent which is the same as the solvent of the liquid cleaning solution.

12. The method of claim 11, further comprising:
discharging, as an effluent, a mixture of the liquid cleaning solution and the rinse solution; and
filtering and recycling the effluent as a new cleaning solution.

* * * * *